(12) United States Patent
Murray et al.

(10) Patent No.: US 12,557,342 B2
(45) Date of Patent: Feb. 17, 2026

(54) TRANSISTOR, INTEGRATED CIRCUIT, AND MANUFACTURING METHOD OF TRANSISTOR

(71) Applicant: Taiwan Semiconductor Manufacturing Company, Ltd., Hsinchu (TW)

(72) Inventors: Neil Quinn Murray, Hsinchu (TW); Kuo-Chang Chiang, Hsinchu (TW); Mauricio Manfrini, Hsinchu County (TW); Tsann Lin, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 727 days.

(21) Appl. No.: 17/740,376

(22) Filed: May 10, 2022

(65) Prior Publication Data

US 2023/0369438 A1 Nov. 16, 2023

(51) Int. Cl.
*H10D 30/67* (2025.01)
*H10D 87/00* (2025.01)
*H10D 99/00* (2025.01)

(52) U.S. Cl.
CPC .......... *H10D 30/6739* (2025.01); *H10D 87/00* (2025.01); *H10D 99/00* (2025.01); *H10D 30/6755* (2025.01)

(58) Field of Classification Search
CPC ............. H01L 29/4908; H01L 27/1207; H01L 29/66969; H01L 29/7869; H10D 30/6739; H10D 87/00; H10D 99/00; H10D 30/6755
See application file for complete search history.

(56) References Cited

U.S. PATENT DOCUMENTS

| | | | | |
|---|---|---|---|---|
| 8,389,994 B2* | 3/2013 | Joo | .......................... | H01L 21/70 257/166 |
| 8,836,039 B2* | 9/2014 | Suzuki et al. | .......... | H01L 21/70 257/369 |
| 10,084,078 B2* | 9/2018 | Nakayama et al. | .... | H01L 29/15 |
| 11,244,943 B2* | 2/2022 | Huang et al. | ....... | H01L 21/8221 |
| 2021/0336004 A1* | 10/2021 | Huang et al. | .......... | H01L 29/775 |
| 2021/0376151 A1* | 12/2021 | Van Dal et al. | .... | H01L 29/7869 257/43 |
| 2022/0140148 A1* | 5/2022 | Nam et al. | .......... | H10D 30/701 257/295 |

(Continued)

OTHER PUBLICATIONS

W. P. Bai et al., "Three-Layer laminated metal gate electrodes with tunable work functions for CMOS applications," in IEEE Electron Device Letters, vol. 26, No. 4, pp. 231-233, Apr. 2005 (Year: 2005).*

(Continued)

*Primary Examiner* — Christine S. Kim
*Assistant Examiner* — Nathalie R Fayette
(74) *Attorney, Agent, or Firm* — JCIPRNET

(57) ABSTRACT

A transistor includes a gate electrode, a gate dielectric layer, a short range order layer, a channel layer, and source/drain regions. The gate dielectric layer is disposed over the gate electrode. The short range order layer is disposed between the gate electrode and the gate dielectric layer. The short ranger order layer has slanted sidewalls. The channel layer is disposed on the gate dielectric layer. The source/drain regions are disposed on the channel layer.

20 Claims, 16 Drawing Sheets

(56) References Cited

U.S. PATENT DOCUMENTS

2022/0352379 A1* 11/2022 Lin et al. ............... H01L 29/78

OTHER PUBLICATIONS

Xiaoniu Fu et al., "Study of grain size and polishing performance of aluminum film as metal gate electrode," 2015 China Semiconductor Technology International Conference, Shanghai, 2015, pp. 1-2 (Year: 2015).*
Rondinelli et al., Researchers open path to finding rare, polarized metals, (Apr. 2, 2014), Phys.org, URL: https://phys.org/news/2014-04-path-rare-polarized-metals.html#google_vignette (Year: 2014).*

* cited by examiner

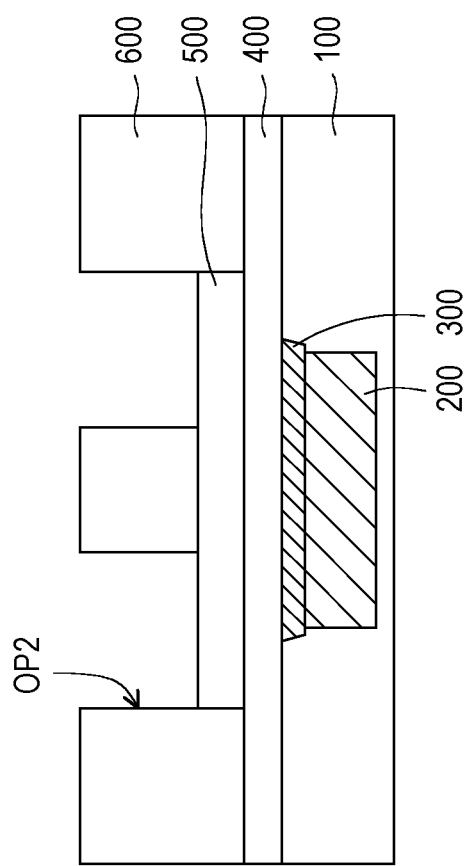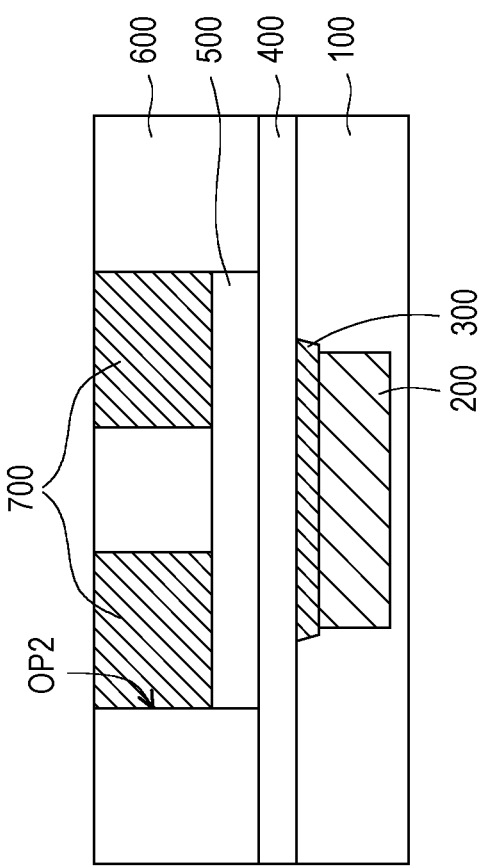

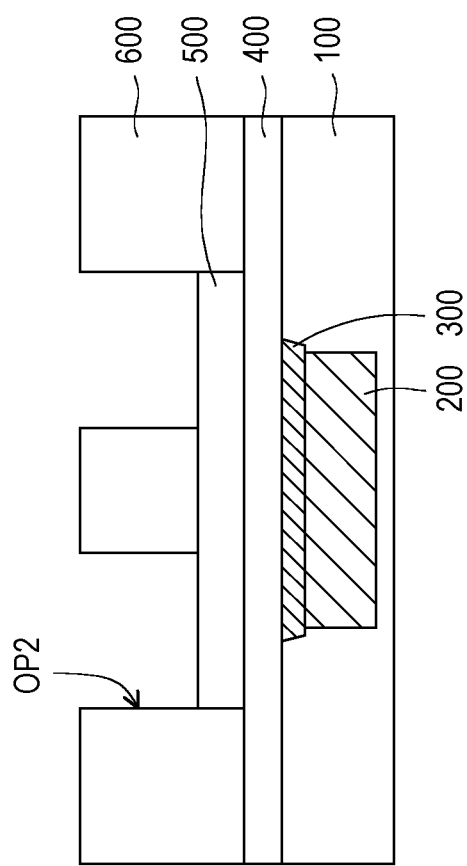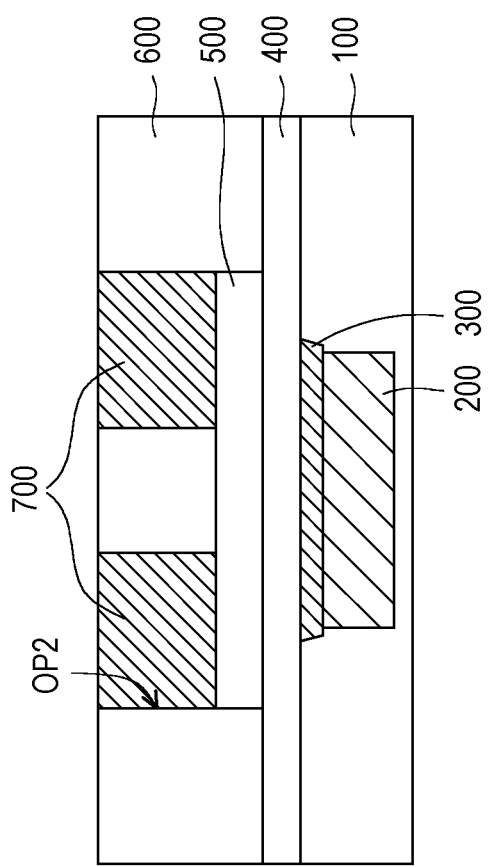

TRANSISTOR, INTEGRATED CIRCUIT, AND MANUFACTURING METHOD OF TRANSISTOR

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2L are cross-sectional views illustrating various stages of the manufacturing method of the second transistor in FIG. 1 in accordance with some embodiments of the disclosure.

DETAILED DESCRIPTION

Figure 1:
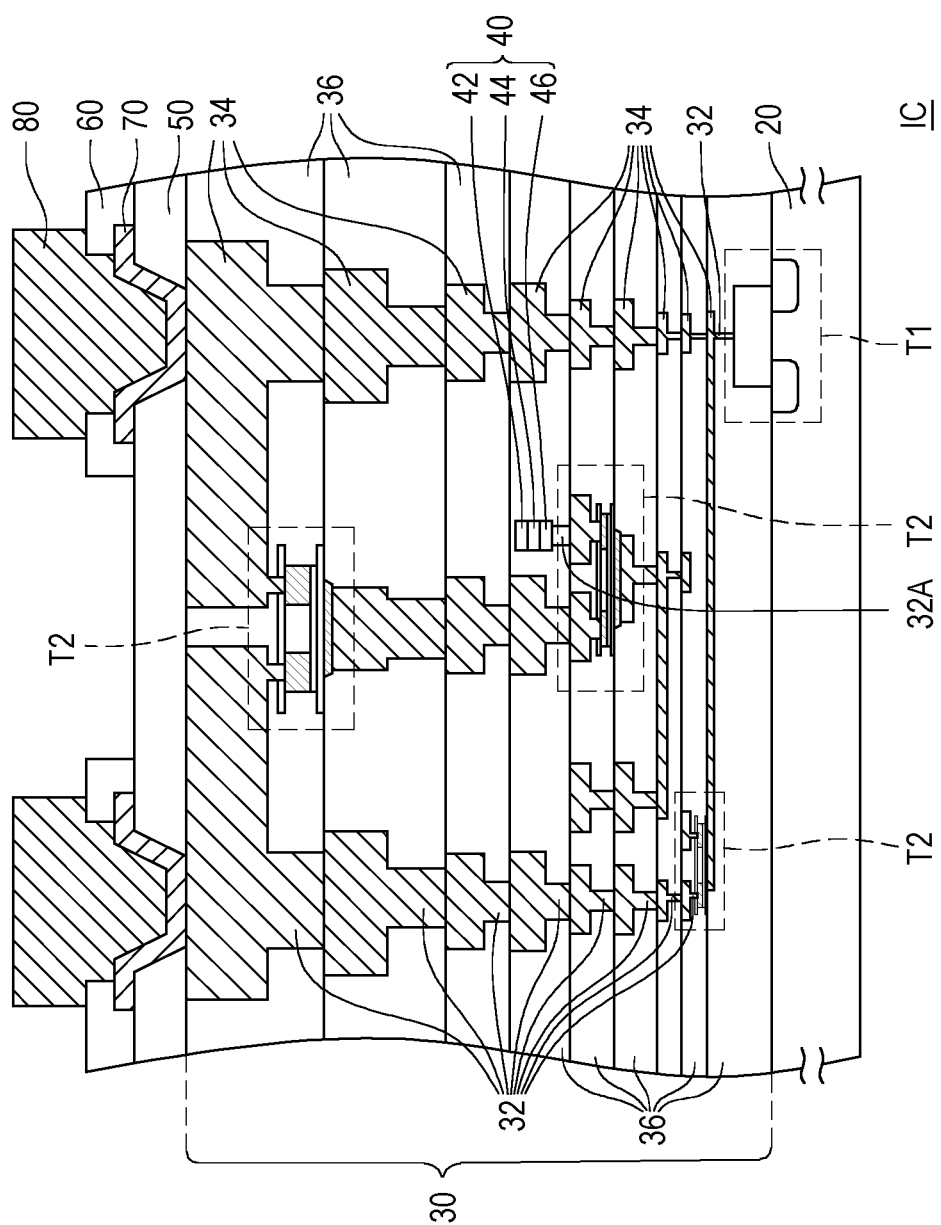
FIG. 1 is a schematic cross-sectional view of an integrated circuit in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional view of an integrated circuit IC in accordance with some embodiments of the disclosure. In some embodiments, the integrated circuit IC includes a substrate 20, an interconnect structure 30, a passivation layer 50, a post-passivation layer 60, a plurality of conductive pads 70, and a plurality of conductive terminals 80. In some embodiments, the substrate 20 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 20 may be a bulk silicon substrate, a silicon-on-insulator (SOI) substrate, or a germanium-on-insulator (GOI) substrate.

In some embodiments, the substrate 20 includes various doped regions depending on circuit requirements (e.g., p-type semiconductor substrate or n-type semiconductor substrate). In some embodiments, the doped regions are doped with p-type or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a first transistor T1, which is over the substrate 20. Depending on the types of the dopants in the doped regions, the first transistor T1 may be referred to as n-type transistor or p-type transistor. In some embodiments, the first transistor T1 further includes a metal gate and a channel under the metal gate. The channel is located between the source region and the drain region to serve as a path for electron to travel when the first transistor T1 is turned on. On the other hand, the metal gate is located above the substrate 20 and is embedded in the interconnect structure 30. In some embodiments, the first transistor T1 is formed using suitable Front-end-of-line (FEOL) process. For simplicity, one first transistor T1 is shown in FIG. 1. However, it should be understood that more than one first transistors T1 may be presented depending on the application of the integrated circuit IC. When multiple first transistors T1 are presented, these first transistors T1 may be separated by shallow trench isolation (STI; not shown) located between two adjacent first transistors T1.

As illustrated in FIG. 1, the interconnect structure 30 is disposed on the substrate 20. In some embodiments, the interconnect structure 30 includes a plurality of conductive vias 32, a plurality of conductive patterns 34, a plurality of dielectric layers 36, a memory cell 40, and a plurality of second transistors T2. As illustrated in FIG. 1, the conductive patterns 34 and the conductive vias 32 are embedded in the dielectric layers 36. In some embodiments, the conductive patterns 34 located at different level heights are connected to one another through the conductive vias 32. In other words, the conductive patterns 34 are electrically connected to one another through the conductive vias 32. In some embodiments, the bottommost conductive vias 32 are connected to the first transistor T1. For example, the bottommost conductive vias 32 are connected to the metal gate, which is embedded in the bottommost dielectric layer 36, of the first transistor T1. In other words, the bottommost conductive vias 32 establish electrical connection between the first transistor T1 and the conductive patterns 34 of the interconnect structure 30. It should be noted that in some alternative cross-sectional views, other bottommost conductive vias 32 are also connected to source/drain regions of the first transistor T1. That is, in some embodiments, the bottommost conductive vias 32 may be referred to as "contact structures" of the first transistor T1.

In some embodiments, a material of the dielectric layers 36 includes polyimide, epoxy resin, acrylic resin, phenol resin, benzocyclobutene (BCB), polybenzooxazole (PBO), or any other suitable polymer-based dielectric material. Alternatively, the dielectric layers 36 may be formed of oxides or nitrides, such as silicon oxide, silicon nitride, aluminum oxide, hafnium oxide, hafnium zirconium oxide, or the like. In some embodiments, different dielectric layers 36 are formed by the same material. However, the disclosure is not limited thereto. In some alternative embodiments, different dielectric layers 36 may be formed by different materials. The dielectric layers 36 may be formed by suitable fabrication techniques, such as spin-on coating, chemical vapor deposition (CVD), plasma-enhanced chemical vapor deposition (PECVD), or the like.

In some embodiments, a material of the conductive patterns 34 and the conductive vias 32 includes aluminum, titanium, copper, nickel, tungsten, or alloys thereof. The conductive patterns 34 and the conductive vias 32 may be formed by electroplating, deposition, and/or photolithography and etching. In some embodiments, the conductive patterns 34 and the underlying conductive vias 32 are formed simultaneously. It should be noted that the number of the dielectric layers 36, the number of the conductive patterns 34, and the number of the conductive vias 32 illustrated in FIG. 1 are merely for illustrative purposes, and the disclosure is not limited thereto. In some alternative embodiments, fewer or more layers of the dielectric layers 36, the conductive patterns 34, and/or the conductive vias 32 may be formed depending on the circuit design.

As illustrated in FIG. 1, the memory cell 40 is embedded in the interconnect structure 30. For example, the memory cell 40 is embedded in the dielectric layers 36. In some embodiments, the memory cell 40 includes a top electrode 42, a storage layer 44, and a bottom electrode 46. The storage layer 44 is sandwiched between the top electrode 42 and the bottom electrode 46. In some embodiments, the memory cell 40 is electrically connected to the underlying conductive pattern 34 through a conductive via 32A located therebetween. In some embodiments, the conductive via 32A is similar to the conductive vias 32, so the detailed descriptions thereof are omitted herein.

In some embodiments, materials of the top electrode 42 and the bottom electrode 46 are identical. However, the disclosure is not limited thereto. In some alternative embodiments, the material of the top electrode 42 may be different from the material of the bottom electrode 46. The material of the top electrode 42 and the bottom electrode 46 includes, for example, gold, platinum, ruthenium, iridium, titanium, aluminum, copper, tantalum, tungsten, an alloy thereof, an oxide thereof, a nitride thereof, a fluoride thereof, a carbide thereof, a boride thereof, a silicide thereof, or the like.

In some embodiments, the storage layer 44 includes a single or composite film of $HfO_2$, $Hr_{1-x}Zr_xO_2$, $ZrO_2$, $TiO_2$, $NiO$, $TaI_x$, $Cu_2O$, $Nb_2O_5$, $Al_2O_3$, $MoO_x$, $CoO$, $ZnO$, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like. The storage layer 44 may be formed by CVD, PECVD, flowable chemical vapor deposition (FCVD), high-density-plasma chemical vapor deposition (HDP-CVD), sub-atmospheric chemical vapor deposition (SACVD), physical vapor deposition (PVD), or atomic layer deposition (ALD). Since the storage layer 44 has a variable resistance, the storage layer 44 may be utilized to store data.

In some embodiments, the second transistors T2 are also embedded in the interconnect structure 30. For example, the second transistors T2 are embedded in the dielectric layers 36. As illustrated in FIG. 1, the conductive via 32A directly contacting the memory cell 40 is connected to one of the second transistors T2. In other words, the memory cell 40 is electrically connected to at least one of the second transistors T2. The formation method and the structure of the second transistors T2 will be described in detail later. In some embodiments, the second transistor T2 and the memory cell 40 may be collectively referred to as a memory device. For example, the second transistor T2 may sever as a selector for the memory device. It should be noted that the memory device illustrated in FIG. 1 may be referred to as Resistive Random Access Memory (RRAM) device. However, the disclosure is not limited thereto. In some alternative embodiments, the memory cell 40 may be replaced with other types of memory cell to render Dynamic Random Access Memory (DRAM) device, Static Random Access Memory (SRAM) device, Magnetoresistive Random Access Memory (MRAM), Ferroelectric Random Access Memory (FeRAM) devices, or the like.

As illustrated in FIG. 1, the passivation layer 50, the conductive pads 70, the post-passivation layer 60, and the conductive terminals 80 are sequentially formed on the interconnect structure 30. In some embodiments, the passivation layer 50 is disposed on the topmost dielectric layer 36 and the topmost conductive patterns 34. In some embodiments, the passivation layer 50 has a plurality of openings partially exposing each topmost conductive pattern 34. In some embodiments, the passivation layer 50 is a silicon oxide layer, a silicon nitride layer, a silicon oxynitride layer, or a dielectric layer formed by other suitable dielectric materials. The passivation layer 50 may be formed by suitable fabrication techniques, such as HDP-CVD, PECVD, or the like.

In some embodiments, the conductive pads 70 are formed over the passivation layer 50. In some embodiments, the conductive pads 70 extend into the openings of the passivation layer 50 to be in direct contact with the topmost conductive patterns 34. That is, the conductive pads 70 are electrically connected to the interconnect structure 30. In some embodiments, the conductive pads 70 include aluminum pads, copper pads, titanium pads, nickel pads, tungsten pads, or other suitable metal pads. The conductive pads 70 may be formed by, for example, electroplating, deposition, and/or photolithography and etching. It should be noted that the number and the shape of the conductive pads 70 illustrated in FIG. 1 are merely for illustrative purposes, and the disclosure is not limited thereto. In some alternative embodiments, the number and the shape of the conductive pad 70 may be adjusted based on demand.

In some embodiments, the post-passivation layer 60 is formed over the passivation layer 50 and the conductive pads 70. In some embodiments, the post-passivation layer 60 is formed on the conductive pads 70 to protect the conductive pads 70. In some embodiments, the post-passivation layer 60 has a plurality of contact openings partially exposing each conductive pad 70. The post-passivation layer 60 may be a polyimide layer, a PBO layer, or a dielectric layer formed by other suitable polymers. In some embodiments, the post-passivation layer 60 is formed by suitable fabrication techniques, such as HDP-CVD, PECVD, or the like.

As illustrated in FIG. 1, the conductive terminals 80 are formed over the post-passivation layer 60 and the conductive pads 70. In some embodiments, the conductive terminals 80 extend into the contact openings of the post-passivation layer 60 to be in direct contact with the corresponding conductive pad 70. That is, the conductive terminals 80 are electrically connected to the interconnect structure 30 through the conductive pads 70. In some embodiments, the conductive terminals 80 are conductive pillars, conductive posts, conductive balls, conductive bumps, or the like. In some embodiments, a material of the conductive terminals 80 includes a variety of metals, metal alloys, or metals and mixture of other materials. For example, the conductive terminals 80 may be made of aluminum, titanium, copper, nickel, tungsten, tin, and/or alloys thereof. The conductive terminals 80 are formed by, for example, deposition, electroplating, screen printing, or other suitable methods. In some embodiments, the conductive terminals 80 are used to establish electrical connection with other components (not shown) subsequently formed or provided.

As mentioned above, the second transistors T2 are embedded in the interconnect structure 30, and at least one of the second transistors T2 is electrically connected to the memory cell 40. In some embodiments, the second transistors T2 are thin film transistors (TFT). Taking the second transistor T2 located directly underneath the memory cell 40 as an example, the formation method and the structure of this second transistor T2 will be described below in conjunction with FIG. 2A to FIG. 2L and FIG. 3A to FIG. 3N.

FIG. 2A to FIG. 2L are cross-sectional views illustrating various stages of the manufacturing method of the second transistor T2 in FIG. 1 in accordance with some embodiments of the disclosure.

Figure 2A:
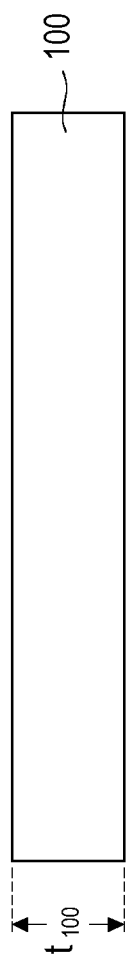

Referring to FIG. 2A, a dielectric layer 100 is provided. In some embodiments, the dielectric layer 100 is one of the dielectric layers 36 of the interconnect structure 30 of FIG. 1. For example, a material of the dielectric layer 100 includes silicon oxide. However, the disclosure is not limited thereto. Other possible materials for the dielectric layers 36 listed above may also be utilized as the material of the dielectric layer 100. In some embodiments, a thickness $t_{100}$ of the dielectric layer 100 ranges from about 50 Å to about 500 Å.

Figure 2B:
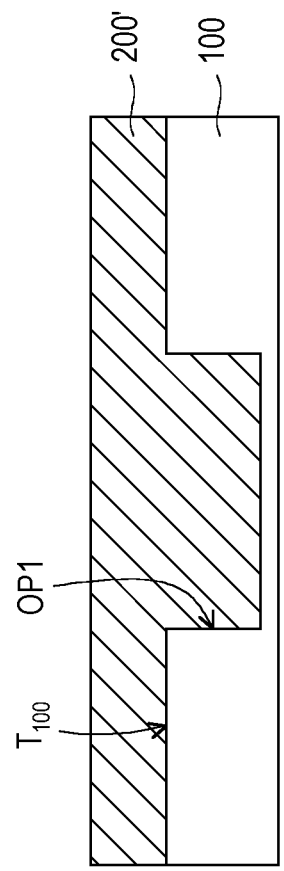

Referring to FIG. 2B, the dielectric layer 100 is patterned to form an opening OP1 in the dielectric layer 100. In some embodiments, the dielectric layer 100 is patterned through a photolithography and etching process. The etching process includes, for example, an anisotropic etching process such as dry etch or an isotropic etching process such as wet etch. In some embodiments, the etchant for the wet etch includes a combination of hydrogen fluoride (HF) and ammonia ($NH_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. After the dielectric layer 100 is patterned to form the opening OP1, a gate electrode material 200' is deposited on the patterned dielectric layer 100. For example, the gate electrode material 200' is formed on a top surface $T_{100}$ of the dielectric layer 100. Meanwhile, the gate electrode material 200' also extends into the opening OP1 of the dielectric layer 100 to fill up the opening OP1. In some embodiments, the gate electrode material 200' is deposited through ALD, CVD, PVD, or the like.

In some embodiments, the gate electrode material 200' includes copper, titanium, tantalum, tungsten, aluminum, zirconium, hafnium, cobalt, titanium aluminum, tantalum aluminum, tungsten aluminum, zirconium aluminum, hafnium aluminum, titanium nitride, any other suitable metal-containing material, or a combination thereof. In some embodiments, the gate electrode material 200' also includes materials to fine-tune the corresponding work function. For example, the gate electrode 200 may also include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof.

Figure 2C:
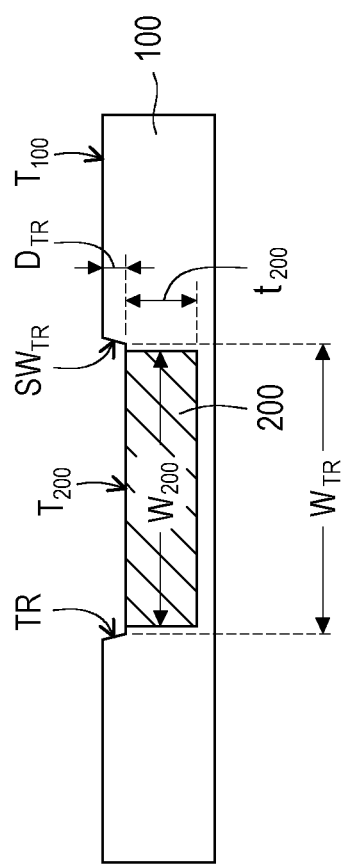

Referring to FIG. 2B and FIG. 2C, a portion of the gate electrode material 200' and a portion of the dielectric layer 100 is removed to form a gate electrode 200 and a trench TR. In some embodiments, the portion of the gate electrode material 200' and the portion of the dielectric layer 100 are removed through an over-polishing process. For example, the gate electrode material 200' located above the top surface $T_{100}$ of the dielectric layer 100 is polished and removed until the top surface $T_{100}$ of the dielectric layer 100 is exposed. Thereafter, the polishing process continues to remove a portion of the dielectric layer 100 and a portion of the gate electrode material 200' below the top surface $T_{100}$ of the dielectric layer 100, so as to form the gate electrode 200 and the trench TR in the dielectric layer 100. In some embodiments, the over-polishing process includes, for example, a mechanical grinding process, a chemical mechanical polishing (CMP) process, or the like.

In some embodiments, the gate electrode 200 is formed such that the dielectric layer 100 laterally surrounds the gate electrode 200. For example, the gate electrode 200 is embedded in the dielectric layer 100. In some embodiment, the gate electrode 200 is formed to have substantially straight sidewalls. In some embodiments, a top surface $T_{200}$ of the gate electrode 200 is located at a level height lower than that of the top surface $T_{100}$ of the dielectric layer 100. In some embodiments, a thickness $t_{200}$ of the gate electrode 200 ranges from about 50 Å to about 500 Å. In some embodiments, a roughness of the top surface $T_{200}$ of the gate electrode 200 ranges from about 5 Å to about 15 Å.

In some embodiments, a barrier layer (not shown) is optionally formed between the gate electrode 200 and the dielectric layer 100, so as to avoid diffusion of atoms between elements. In some embodiments, materials of the barrier layer includes titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or a combination thereof.

As illustrated in FIG. 2C, the trench TR is formed above the gate electrode 200. For example, the trench TR exposes the top surface $T_{200}$ of the gate electrode 200. In some embodiments, the trench TR is formed to have slanted sidewalls SWTR. For example, a width of the trench TR gradually decreases from the top surface $T_{100}$ of the dielectric layer 100 toward the top surface $T_{200}$ of the gate electrode 200. In other words, the trench TR is a hollow space of square frustum in a three-dimensional view. In some embodiments, the trench TR has a minimum width WTR at a bottom surface thereof. In some embodiments, the bottom surface of the trench TR is coplanar with the top surface $T_{200}$ of the gate electrode 200. As illustrated in FIG. 2C, the minimum width WTR of the trench TR is larger than a width $W_{200}$ of the gate electrode 200. For example, the trench TR not only exposes the top surface $T_{200}$ of the gate electrode 200, but also exposes a portion of the dielectric layer 100 in proximity with the gate electrode 200.

Figure 2D:
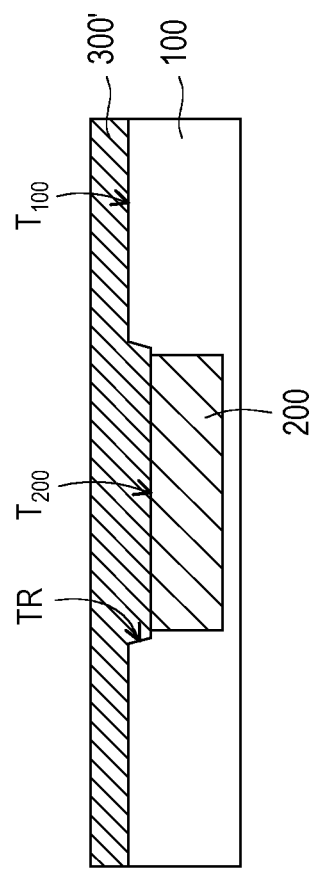

Referring to FIG. 2D, a short range order material layer 300' is formed on the dielectric layer 100 and the gate electrode 200. For example, the short range order material layer 300' not only covers the top surface $T_{100}$ of the dielectric layer 100, but also extends into the trench TR to fill up the trench TR. In some embodiments, the short range order material layer 300' completely covers the top surface $T_{200}$ of the gate electrode 200. For example, the short ranger order material layer 300' is in physical contact with the top surface $T_{200}$ of the gate electrode 200. In some embodiments, the short range order layer 300 includes a metallic material and a dopant. The metallic material includes, for example, TiN, Wn, CoTiN, MoN, TaN, or a combination thereof. On the other hand, the dopant includes, for example, Mg, Al, Ti, Ca, Mn, Si, or a combination thereof. In some embodiments, an amount of the dopant ranges from about 0.1 at % (atomic percentage) to about 5 at %. Throughout the description, the term "short ranger order" refers to regular and predictable arrangement of atoms only over a short distance (for example, with one or two atom spacings), and this regularity does not persist over a long distance. For example, the atoms in the short range order material layer 300' is neither in an amorphous state nor in a crystalline state. Instead, the atoms in the short range order material layer 300' are in a state between the amorphous state and the crystalline state. In some embodiments, the short range order material layer 300' has small grain size. In some embodiments, the short range order material layer 300' is deposited through ALD, CVD, PVD, or the like.

Figure 2E:
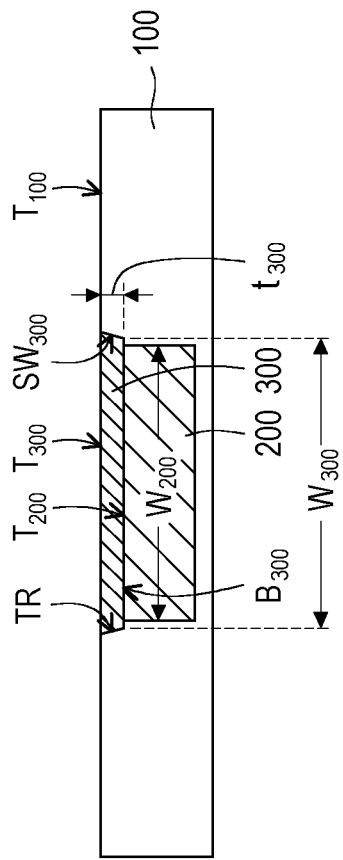

Referring to FIG. 2D and FIG. 2E, a portion of the short range order material layer 300' is removed to form a short range order layer 300 on the gate electrode 200. In some embodiments, the portion of the short range order material layer 300' located above the top surface $T_{100}$ of the dielectric layer 100 is polished and removed until the top surface $T_{100}$ of the dielectric layer 100 is exposed, so as to form the short range order layer 300. That is, the remaining short range order material layer 300', which fills up the trench TR, constitutes the short range order layer 300. In some embodiments, the polishing process includes, for example, a mechanical grinding process, a CMP process, or the like.

In some embodiments, the short range order layer 300 is formed such that the dielectric layer 100 laterally surrounds the short range order layer 300. For example, the short range order layer 300 is embedded in the dielectric layer 100. In some embodiments, a top surface $T_{300}$ of the short range order layer 300 is substantially coplanar with the top surface $T_{100}$ of the dielectric layer 100. On the other hand, a bottom surface $B_{300}$ of the short range order layer 300 is in physical contact with the top surface $T_{200}$ of the gate electrode 200. In some embodiments, since the short range order layer 300 is formed by filling up the trench TR, the shape and the geometry of the short range order layer 300 is substantially identical to the shape and the geometry of the trench TR. For example, the short range order layer 300 has slanted sidewalls $SW_{300}$. In some embodiments, a width of the short range order layer 300 gradually decreases from the top surface $T_{100}$ of the dielectric layer 100 toward the top surface $T_{200}$ of the gate electrode 200. In other words, the short ranger order layer 300 is a square frustum in a three-dimensional view. In some embodiments, the short ranger order layer 300 has a minimum width $W_{300}$ at the bottom surface $B_{300}$ thereof. As illustrated in FIG. 2E, the minimum width $W_{300}$ of the short range order layer 300 is larger than the width $W_{200}$ of the gate electrode 200. For example, the bottom surface $B_{300}$ of the short range order layer 300 not only is in physical contact with the top surface $T_{200}$ of the gate electrode 200, but also is in physical contact with a portion of the dielectric layer 100 in proximity with the gate electrode 200. In some embodiments, not only the minimum width $W_{300}$ of the short range order layer 300 is larger than the width $W_{200}$ of the gate electrode 200, but also the minimum length (not shown; also located at the bottom surface $B_{300}$ of the short range order layer 300) of the short range order layer 300 is larger than the length (not shown) of the gate electrode 200. In other words, an area of the bottom surface $B_{300}$ of the short range order layer 300 is larger than an area of the top surface $T_{200}$ of the gate electrode 200. In some embodiments, a span of the short range order layer 300 is larger than a span of the gate electrode 200. For example, the gate electrode 200 is located within the span of the short range order layer 300. In other words, the short range order layer 300 extends beyond the sidewalls of the gate electrode 200. In some embodiments, a thickness $t_{300}$ of the short range order layer 300 ranges from about 10 Å to about 100 Å.

As mentioned above, since the atoms in the short range order material layer 300' is in a state between the amorphous state and the crystalline state and has small grain size, the short ranger order material layer 300' can be easily polished to form the short range order layer 300 with uniform and smooth top surface $T_{300}$. For example, the roughness of the top surface $T_{200}$ of the gate electrode 200 is greater than a roughness of the top surface $T_{300}$ of the short range order layer 300. As mentioned above, the roughness of the top surface $T_{200}$ of the gate electrode 200 ranges from about 5 Å to about 15 Å. On the other hand, the roughness of the top surface $T_{300}$ of the short range order layer 300 ranges from about 0 Å to about 5 Å. In other words, the roughness of the top surface $T_{300}$ of the short range order layer 300 may be about 1/3 to about 1/15 of the roughness of the top surface $T_{200}$ of the gate electrode 200. In some embodiments, the gate electrode 200 and the short range order layer 300 collectively correspond to one of the conductive patterns 34 in the interconnect structure 30 of FIG. 1.

Figure 2F:
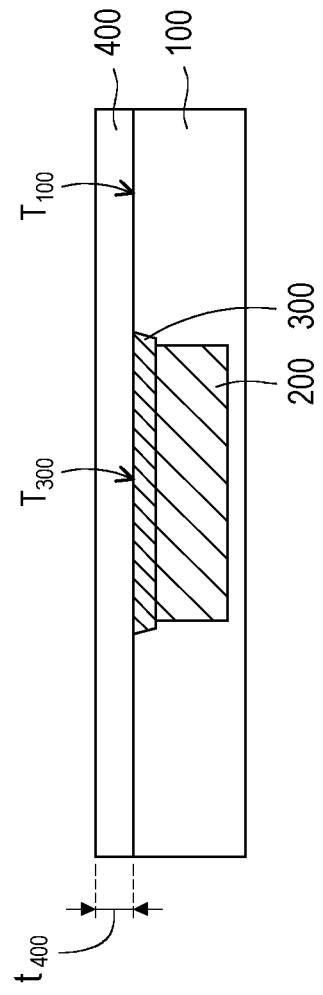

Referring to FIG. 2F, a gate dielectric layer 400 is formed over the dielectric layer 100, the gate electrode 200, and the short range order layer 300. For example, the gate dielectric layer 400 is in physical contact with the top surface $T_{100}$ of the dielectric layer 100 and the top surface $T_{300}$ of the short range order layer 300. In some embodiments, the gate dielectric layer 400 includes silicon oxide, silicon nitride, silicon oxynitride, high-k dielectrics, or a combination thereof. It should be noted that the high-k dielectric materials are generally dielectric materials having a dielectric constant higher than 4, greater than about 12, greater than about 16, or even greater than about 20. In some embodiments, the gate dielectric layer 400 includes metal oxides, metal nitrides, metal silicates, transition metal-oxides, transition metal-nitrides, transition metal-silicates, oxynitrides of metals, metal aluminates, or combinations thereof. For example, the gate dielectric layer 400 includes hafnium oxide ($HfO_2$), hafnium silicon oxide (HfSiO), hafnium silicon oxynitride (HfSiON), hafnium tantalum oxide (HfTaO), hafnium lanthanum oxide (HfLaO), hafnium titanium oxide (HfTiO), hafnium zirconium oxide (HfZrO), zirconium silicate, zirconium aluminate, silicon nitride, silicon oxynitride, zirconium oxide, titanium oxide, aluminum oxide ($Al_2O_3$), hafnium dioxide-alumina ($HfO_2$—$Al_2O_3$) alloy, and/or combinations thereof. The gate dielectric layer 400 may be formed by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. In some embodiments, a thickness $t_{400}$ of the gate dielectric layer 400 ranges from about 30 Å to about 150 Å.

As illustrated in FIG. 2F, the short range order layer 300 is disposed between the gate electrode 200 and the gate dielectric layer 400. As mentioned above, the top surface $T_{300}$ of the short range order layer 300 is much smoother than the top surface $T_{200}$ of the gate electrode 200. As such, the presence of the short range order layer 300 provides a smooth, uniform, defect-free interface between the gate oxide (i.e. the gate dielectric layer 400) and the gate metal (i.e. the gate electrode 200 and the short range order layer 300). Moreover, the short range order quality and the nature in small grain size of the short range order layer 300 allow minimization of defect states in the gate dielectric layer 400 due to grain boundary/defect state induced stress. As such, the quality of the interface between the short range order layer 300 and the gate dielectric layer 400 may be further ensured. Furthermore, in some embodiments, the chemical composition of the short range order layer 300 can be tuned to be oxidation resistant, so as to minimize the presence of the native oxide and the creation of metal oxide at the interface between the short range order layer 300 and the gate dielectric layer 400, thereby preventing a change in the dielectric constant (k value). In sum, the short range order layer 300 may serve as buffer layer between the gate electrode 200 and the gate dielectric layer 400, so as to provide a smooth, uniform, defect-free interface between the gate oxide (i.e. the gate dielectric layer 400) and the gate metal (i.e. the gate electrode 200 and the short range order layer 300). As a result, the performance of the subsequently formed second transistor T2 may be sufficiently optimized.

Figure 2G:
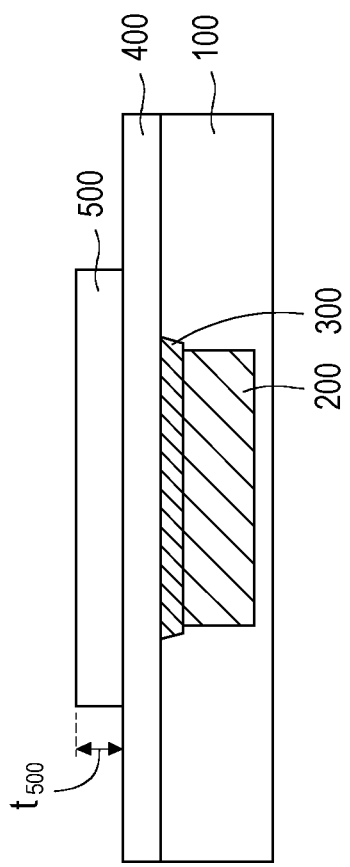

Referring to FIG. 2G, a channel layer 500 is formed on the gate dielectric layer 400. In some embodiments, the channel layer 500 includes oxide semiconductor materials. Examples of the oxide semiconductor material includes $Ga_2O_3$, $In_2O_3$, ZnO, $SnO_2$, IGZO (Indium Gallium Zinc Oxide), IZO (Indium Zinc Oxide), $In_xGa_yZn_zMO$ (M is Ti, Al, Ag, Ce, or Sn, $0<x<1$, $0\le y\le 1$, and $0\le z\le 1$), or a combination thereof. In some embodiments, the channel layer 500 is deposited by suitable techniques, such as CVD, ALD, PVD, PECVD, epitaxial growth, or the like. In some embodiments, a thickness $t_{500}$ of the channel layer 500 ranges from about 30 Å to about 200 Å. As illustrated in FIG. 2G, the channel layer 500 vertically overlaps with the gate electrode 200 and the short range order layer 300 and exposes a portion of the gate dielectric layer 400.

Figure 2H:
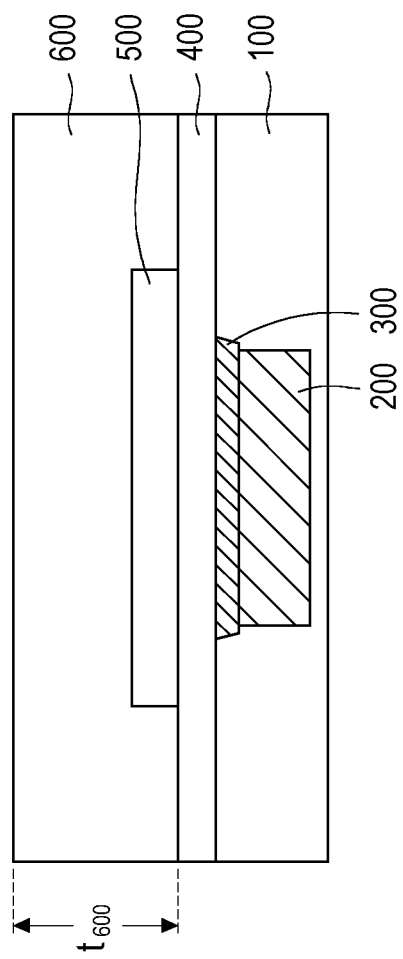

Referring to FIG. 2H, a dielectric layer 600 is formed over the dielectric layer 100, the gate electrode 200, the short range order layer 300, the gate dielectric layer 400, and the channel layer 500. In some embodiments, the dielectric layer 600 is stacked on the dielectric layer 100. In addition, the dielectric layer 600 covers the gate dielectric layer 400 and the channel layer 500. In other words, the channel layer 500 is embedded in the dielectric layer 600. As mentioned above, the dielectric layer 100 is one of the dielectric layers 36 of the interconnect structure 30 of FIG. 1. Similarly, the dielectric layer 600 is another one of the dielectric layers 36 of the interconnect structure 30 of FIG. 1, so the detailed descriptions thereof is omitted herein. In some embodiments, a material of the dielectric layer 600 is different from the material of the dielectric layer 100. For example, as mentioned above, the material of the dielectric layer 100 includes silicon oxide. Under this scenario, the material of the dielectric layer 600 may include aluminum oxide, hafnium oxide, hafnium zirconium oxide, or the like. However, the disclosure is not limited thereto. Other possible materials for the dielectric layers 36 listed above may also be utilized as the material of the dielectric layer 600. In some embodiments, a thickness $t_{600}$ of the dielectric layer 600 ranges from about 30 Å to about 150 Å.

Referring to FIG. 2I, a plurality of openings OP2 is formed in the dielectric layer 600 near two ends of the channel layer 500. In some embodiments, the openings OP2 extend from a top surface of the dielectric layer 600 to a top surface of the channel layer 500. That is, the openings OP2 penetrate through the dielectric layer 600 to partially expose the channel layer 500. In some embodiments, the openings OP2 are formed through a photolithography and etching process. The etching process includes, for example, an anisotropic etching process such as dry etch or an isotropic etching process such as wet etch. In some embodiments, the etchant for the wet etch includes a combination of HF and $NH_3$, a combination of HF and TMAH, or the like. On the other hand, the dry etch process includes, for example, RIE, ICP etch, ECR etch, NBE, and/or the like.

Referring to FIG. 2J, source/drain regions 700 are formed in the openings OP2. For example, the source/drain regions 700 fill up the openings OP2 of the dielectric layer 600. In other words, the source/drain regions 700 are embedded in the dielectric layer 600. In some embodiments, the source/drain regions 700 are formed near two ends of the channel layer 500. In some embodiments, a material of the source/drain regions 700 includes cobalt, tungsten, copper, titanium, tantalum, aluminum, zirconium, hafnium, a combination thereof, or other suitable metallic materials. In some embodiments, the source/drain regions 700 are formed through CVD, ALD, plating, or other suitable deposition techniques.

Figure 2K:
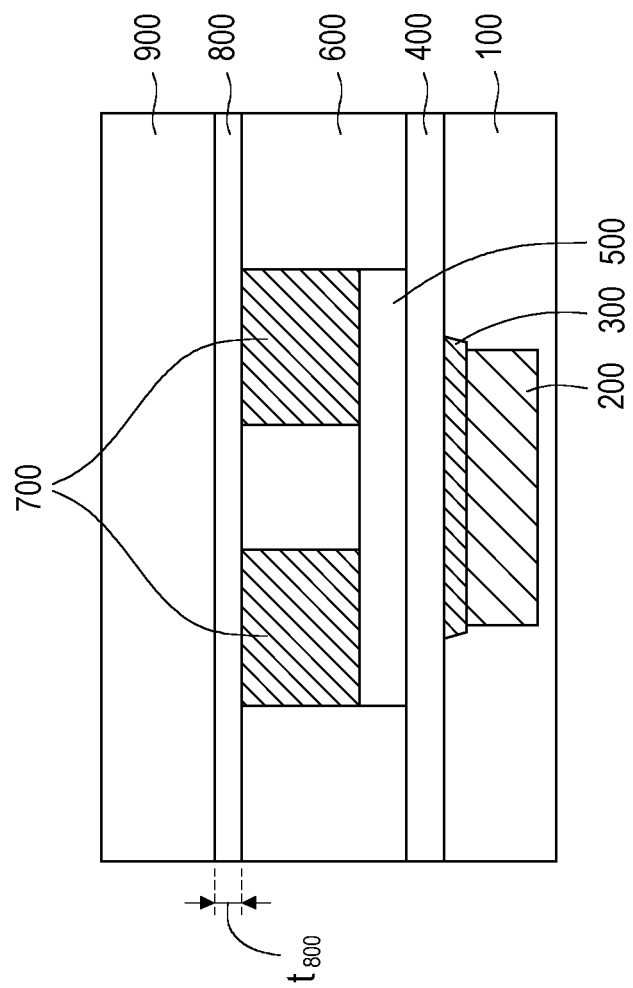

Referring to FIG. 2K, a cap layer 800 and a dielectric layer 900 are sequentially formed on the dielectric layer 600 and the source/drain regions 700. In some embodiments, the cap layer 800 is formed to extend horizontally over the dielectric layer 600 and the source/drain regions 700. For example, the cap layer 800 is formed to be in physical contact with the dielectric layer 600 and the source/drain regions 700. In some embodiments, a material of the cap layer 800 includes silicon oxide or the like. In some embodiments, a thickness $t_{800}$ of the cap layer 800 ranges from about 10 Å to about 200 Å.

In some embodiments, the dielectric layer 900 is similar to the dielectric layer 600. For example, the dielectric layer 600 may be considered as a portion of one of the dielectric layers 36 of the interconnect structure 30 of FIG. 1 while the dielectric layer 900 may be considered as another portion of the same dielectric layer 36. As such, the detailed description of the dielectric layer 900 is omitted herein.

Figure 2L:
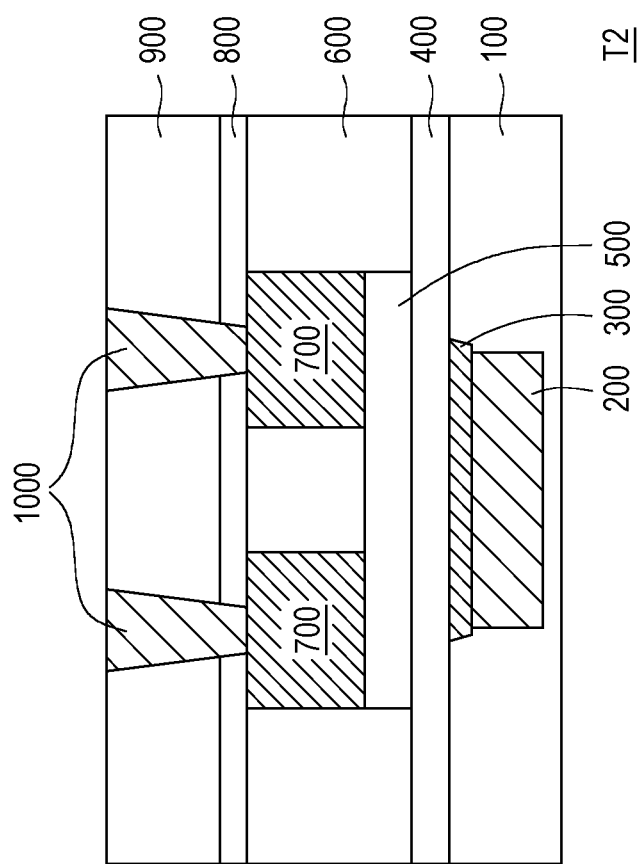

Referring to FIG. 2L, source/drain contacts 1000 are formed on the source/drain regions 700. In some embodiments, the source/drain contacts 1000 are formed by the following steps. First, a plurality of openings (not shown) is formed in the gate dielectric layer 900 and the cap layer 800 to expose at least a portion of the source/drain regions 700. After the openings are formed, a metallic material is filled into the openings, so as to form the source/drain contacts 1000. In some embodiments, a material of the source/drain contacts 1000 is the same as the material of the source/drain regions 700. However, the disclosure is not limited thereto. In some alternative embodiments, the material of the source/drain contacts 1000 may be different from the material of the source/drain regions 700. In some embodiments, the material of the source/drain contacts 1000 includes cobalt, tungsten, copper, titanium, tantalum, aluminum, zirconium, hafnium, a combination thereof, or other suitable metallic materials. In some embodiments, the metallic material of the source/drain contacts 1000 is formed through CVD, ALD, plating, or other suitable deposition techniques. As illustrated in FIG. 2L, the source/drain contacts 1000 penetrate through the dielectric layer 900 and the cap layer 800 to be in physical contact with the source/drain regions 700. In other words, the source/drain contacts 1000 are electrically connected to the source/drain regions 700 to serve as contact plugs for transmitting signal between the source/drain regions 700 and other components.

After the source/drain contacts 1000 are formed, the formation of the second transistor T2 is substantially completed. As mentioned above, the second transistor T2 is embedded in the interconnect structure 30, which is being considered as formed during back-end-of-line (BEOL) process. That is, the second transistor T2 is being considered as formed during BEOL process. In some embodiments, the second transistor T2 may be referred to as a bottom gate transistor or a back gate transistor.

Referring to FIG. 1 and FIG. 2L, the source/drain contacts 1000 extend from the source/drain regions 700 to the conductive patterns 34 of the interconnect structure 30. In other words, the second transistors T2 is electrically connected to the first transistor T1 and the conductive terminals 80 through the conductive vias 32 and the conductive patterns 34 of the interconnect structure 30.

As mentioned above, the second transistors T2 may be a selector for a memory device. However, the disclosure is not limited thereto. In some alternative embodiments, the second transistors T2 may be power gates used to switch off logic blocks in standby or input/output (I/O) devices acting as the interface between a computing element (such as a CPU) and an external component (such as a hard drive).

FIG. 2A to FIG. 2L illustrated an exemplary manufacturing method of the second transistor T2 in FIG. 1. However, the disclosure is not limited thereto. In some alternative embodiments, the second transistor T2 in FIG. 1 may be formed by other manufacturing methods. An alternative manufacturing method of the second transistor T2 in FIG. 1 will be described below in conjunction with FIG. 3A to FIG. 3N.

Figure 3A:
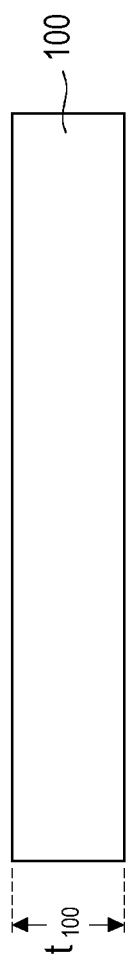
FIG. 3A to FIG. 3N are cross-sectional views illustrating various stages of the manufacturing method of the second transistor in FIG. 1 in accordance with some alternative embodiments of the disclosure.
Figure 3B:
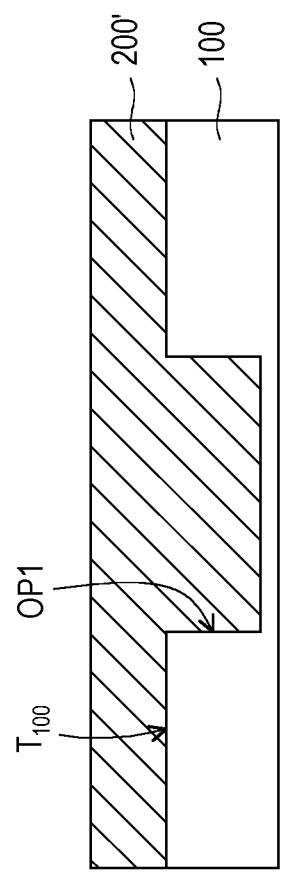
Figure 3C:
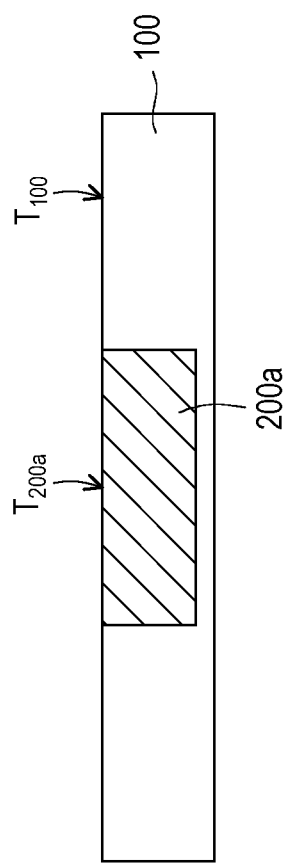
Figure 3D:
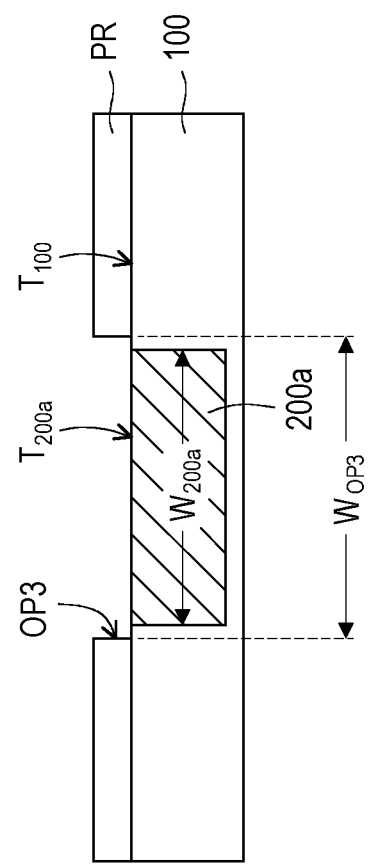
Figure 3E:
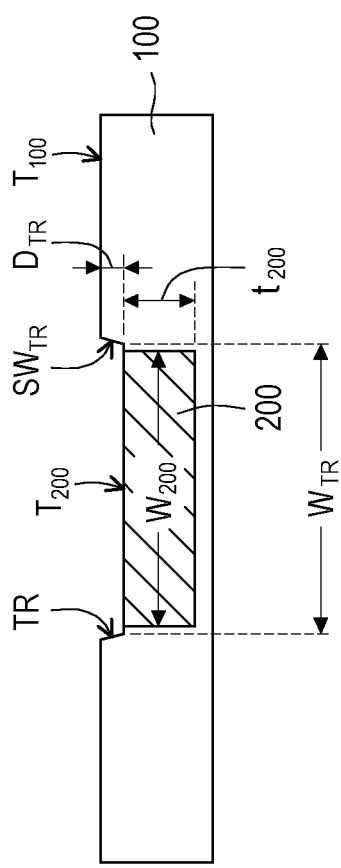
Figure 3F:
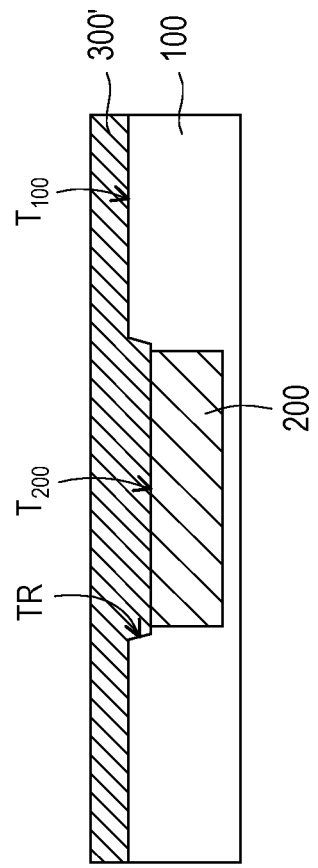
Figure 3G:
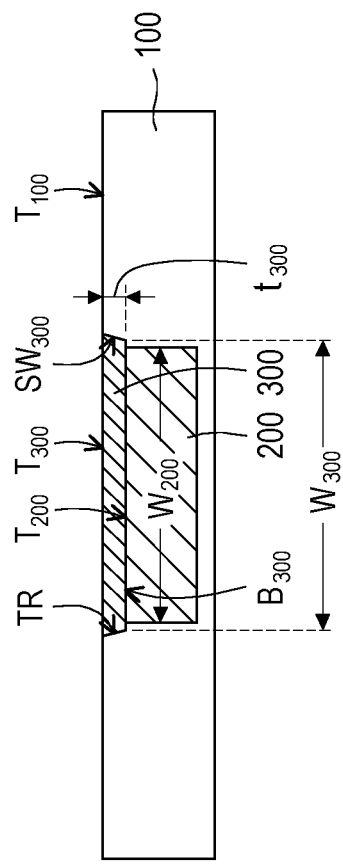
Figure 3H:
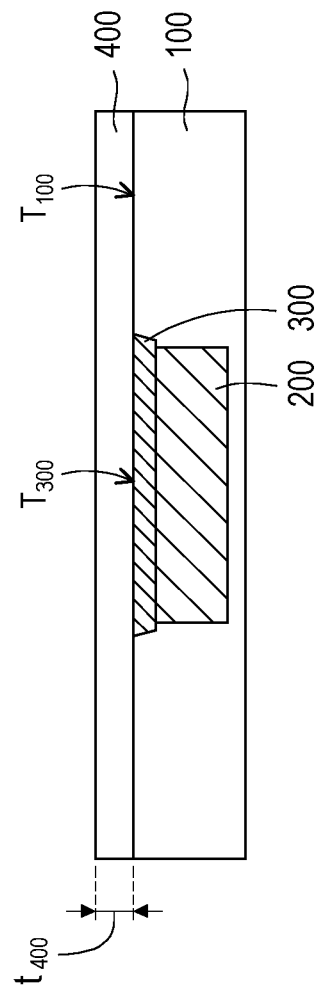
Figure 3I:
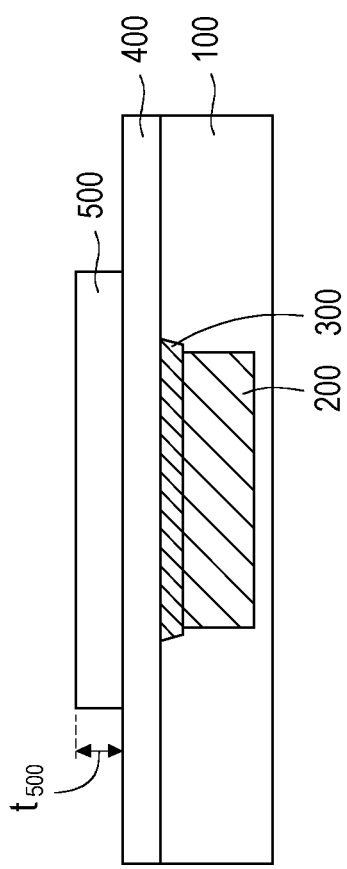
Figure 3J:
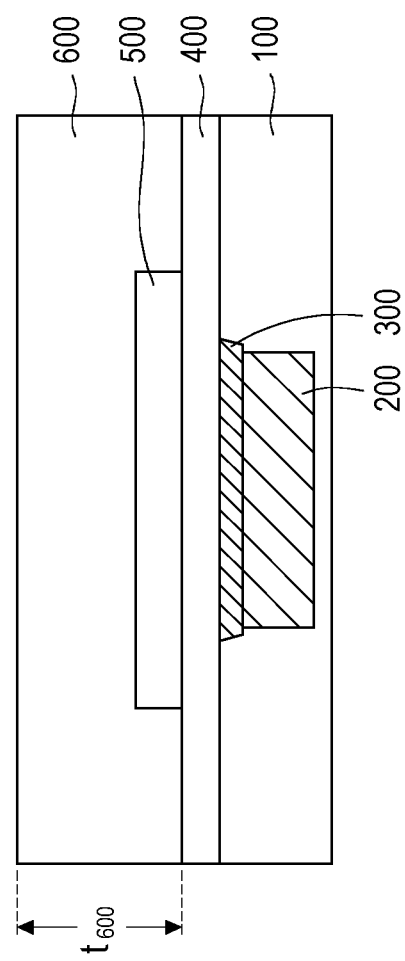
Figure 3M:
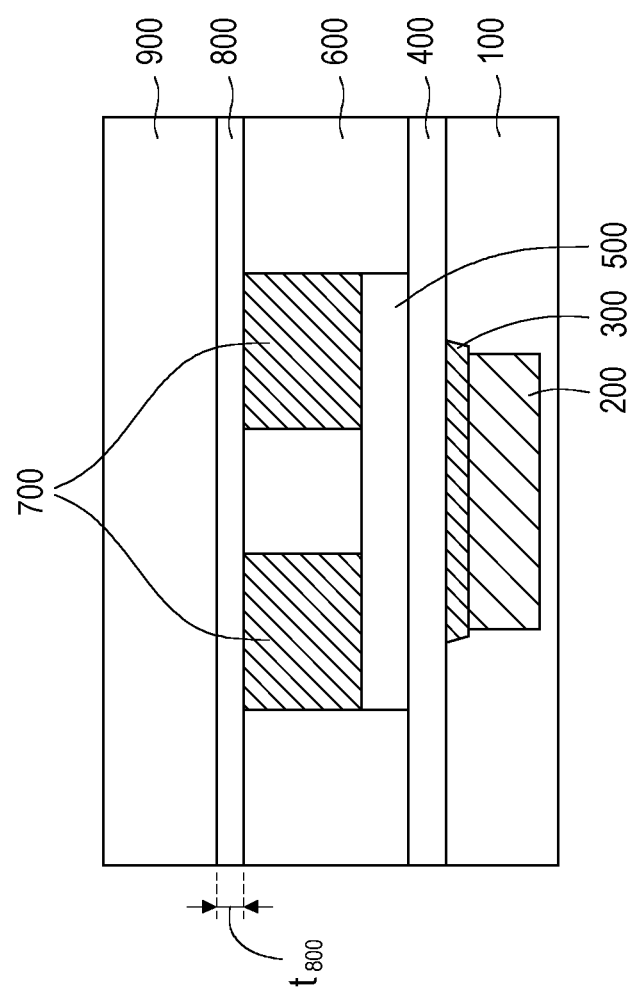
Figure 3N:
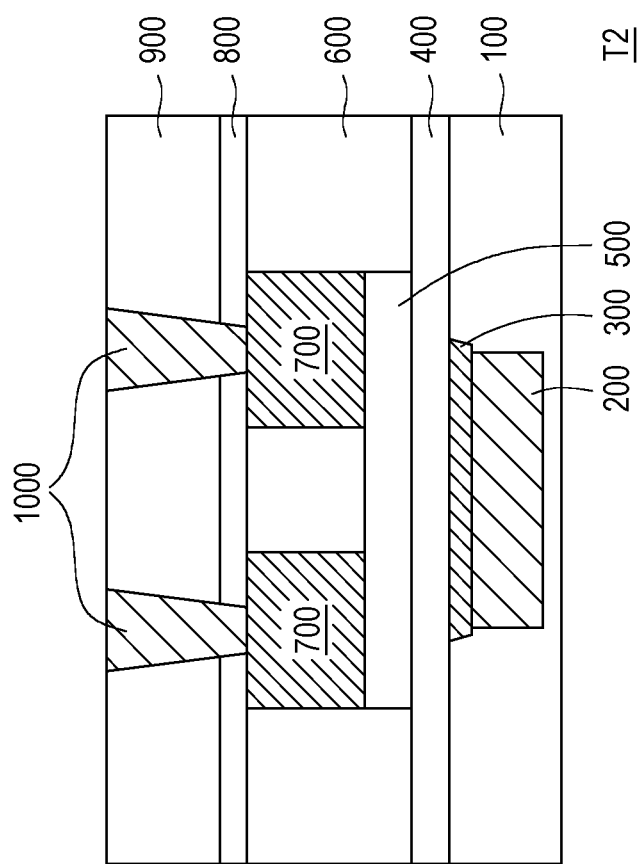

FIG. 3A to FIG. 3N are cross-sectional views illustrating various stages of the manufacturing method of the second transistor T2 in FIG. 1 in accordance with some alternative embodiments of the disclosure. Referring to FIG. 3A and FIG. 3B, the steps shown in FIG. 3A and FIG. 3B are respectively similar to the steps shown in FIG. 2A to FIG. 2B, so the detailed descriptions thereof are omitted herein.

Referring to FIG. 3B and FIG. 3C, a portion of the gate electrode material 200' is removed to form an intermediate gate electrode 200a. In some embodiments, the portion of the gate electrode material 200' is removed through a polishing process. For example, the gate electrode material 200' located above the top surface $T_{100}$ of the dielectric layer 100 is polished and removed until the top surface $T_{100}$ of the dielectric layer 100 is exposed, so as to form the intermediate gate electrode 200a in the dielectric layer 100. In some embodiments, the polishing process includes, for example, a mechanical grinding process, a CMP process, or the like. In some embodiments, the intermediate gate electrode 200a is formed such that the dielectric layer 100 laterally surrounds the intermediate gate electrode 200a. For example, the intermediate gate electrode 200a is embedded in the dielectric layer 100. In some embodiments, the intermediate gate electrode 200a is formed to have substantially straight sidewalls. As illustrated in FIG. 3C, a top surface $T_{200a}$ of the intermediate gate electrode 200a is substantially coplanar with the top surface $T_{100}$ of the dielectric layer 100.

Referring to FIG. 3D, a photoresist layer PR is formed on the dielectric layer 100. In some embodiments, the photoresist layer PR has an opening OP3. In some embodiments, a width $W_{OP3}$ of the opening OP3 is larger than a width $W_{200a}$ of the intermediate gate electrode 200a. For example, the opening OP3 of the photoresist layer PR exposes the entire top surface $T_{200a}$ of the intermediate gate electrode 200 and a portion of the top surface $T_{100}$ of the dielectric layer 100.

Referring to FIG. 3D and FIG. 3E, using the photoresist layer PR as a mask, a portion of the intermediate gate electrode 200a and a portion of the dielectric layer 100 exposed by the photoresist layer PR are removed through an etching process to form a gate electrode 200 and a trench TR above the gate electrode 200. The etching process includes, for example, an anisotropic etching process such as dry etch or an isotropic etching process such as wet etch. In some embodiments, the etchant for the wet etch includes a combination of HF and $NH_3$, a combination of HF and TMAH, or the like. On the other hand, the dry etch process includes, for example, RIE, ICP etch, ECR etch, NBE, and/or the like. After the etching process, the photoresist layer PR is removed through a stripping process or an ashing process. In some embodiments, the gate electrode 200 and the trench TR in FIG. 3E are respectively similar to the gate electrode 200 and the trench TR in FIG. 2C, so the detailed descriptions thereof are omitted herein.

Referring to FIG. 3F to FIG. 3N, the steps shown in FIG. 3F to FIG. 3N are respectively similar to the steps shown in FIG. 2D to FIG. 2L, so the detailed descriptions thereof are omitted herein. As illustrated in FIG. 3N, the second transistor T2 similar to the second transistor T2 in FIG. 2L is obtained.

In accordance with some embodiments of the disclosure, a transistor includes a gate electrode, a gate dielectric layer, a short range order layer, a channel layer, and source/drain regions. The gate dielectric layer is disposed over the gate electrode. The short range order layer is disposed between the gate electrode and the gate dielectric layer. The short range order layer has slanted sidewalls. A channel layer is disposed on the gate dielectric layer. The source/drain regions are disposed on the channel layer.

In accordance with some embodiments of the disclosure, an integrated circuit includes a substrate, a first transistor, and an interconnect structure. The first transistor is over the substrate. The interconnect structure is disposed on the substrate. The interconnect structure includes dielectric layers and a second transistor embedded in the dielectric layers. The second transistor includes a gate electrode, a gate dielectric layer, a short range order layer, a channel layer, and source/drain regions. The gate dielectric layer is disposed over the gate electrode. The short range order layer is disposed between the gate electrode and the gate dielectric layer. The short range order layer has slanted sidewalls. The channel layer is disposed on the gate dielectric layer. The source/drain regions are disposed on the channel layer.

In accordance with some embodiments of the disclosure, a manufacturing method of a transistor includes at least the following steps. A dielectric layer is provided. A gate electrode is formed in the dielectric layer. A trench is formed in the dielectric layer. The trench exposes a top surface of the gate electrode and has slanted sidewalls. The trench is filled up by a short range order material to form a short range order layer on the gate electrode. A gate dielectric layer is deposited on the dielectric layer and the short range order layer. A channel layer is formed on the gate dielectric layer. Source/drain regions are formed on the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
   a gate electrode;
   a gate dielectric layer disposed over the gate electrode;
   a short range order layer disposed between the gate electrode and the gate dielectric layer, wherein the short range order layer has slanted sidewalls, the short range order layer comprises a metallic material and a dopant, and an amount of the dopant ranges from about 0.1 at % to about 5 at %;
   a channel layer disposed on the gate dielectric layer; and
   source/drain regions disposed on the channel layer.

2. The transistor of claim 1, wherein an area of a bottom surface of the short range order layer is larger than an area of a top surface of the gate electrode.

3. The transistor of claim 2, wherein the bottom surface of the short range order layer is in physical contact with the top surface of the gate electrode.

4. The transistor of claim 1, wherein the metallic material comprises TIN, WN, CoTiN, MON, TaN, or a combination thereof.

5. The transistor of claim 4, wherein the dopant comprises Mg, Al, Ti, Ca, Mn, Si, or a combination thereof.

6. The transistor of claim 1, wherein a roughness of a top surface of the gate electrode is greater than a roughness of a top surface of the short range order layer.

7. The transistor of claim 1, further comprising a cap layer extending horizontally over the source/drain regions.

8. The transistor of claim 1, wherein the short range order layer is a square frustum in a three-dimensional view.

9. An integrated circuit, comprising:
   a substrate;
   a first transistor over the substrate; and
   an interconnect structure disposed on the substrate, comprising;
      dielectric layers; and
      a second transistor embedded in the dielectric layers, comprising:
         a gate electrode;
         a gate dielectric layer disposed over the gate electrode;
         a short range order layer disposed between the gate electrode and the gate dielectric layer, wherein the short range order layer has slanted sidewalls, the short range order layer comprises WN, CoTiN, MON, or a combination thereof, and an area of a bottom surface of the short range order layer is larger than an area of a top surface of the gate electrode;
         a channel layer disposed on the gate dielectric layer; and
         source/drain regions disposed on the channel layer.

10. The integrated circuit of claim 9, wherein the interconnect structure further comprises a memory cell embedded in the dielectric layers, and the second transistor is electrically connected to the memory cell.

11. The integrated circuit of claim 9, wherein the dielectric layers comprise a first dielectric layer and a second dielectric layer stacked on the first dielectric layer, the gate electrode and the short range order layer are embedded in the first dielectric layer, and the channel layer and the source/drain regions are embedded in the second dielectric layer.

12. The integrated circuit of claim 11, wherein a material of the first dielectric layer is different from a material of the second dielectric layer.

13. The integrated circuit of claim 9, wherein the short range order layer further comprises a dopant, and the dopant comprises Mg, Al, Ti, Ca, Mn, Si, or a combination thereof.

14. The integrated circuit of claim 9, wherein the short range order layer is a square frustum in a three-dimensional view.

15. A manufacturing method of a transistor, comprising:
   providing a dielectric layer;
   forming a gate electrode in the dielectric layer;
   forming a trench in the dielectric layer, wherein the trench exposes a top surface of the gate electrode and has slanted sidewalls;
   filling up the trench by a short range order material to form a short range order layer on the gate electrode, wherein the short order layer has slanted sidewalls, the short range order layer comprises a metallic material and a dopant, and an amount of the dopant ranges from about 0.1 at % to about 5 at %;
   depositing a gate dielectric layer on the dielectric layer and the short range order layer such that the short range order layer is disposed between the gate electrode and the gate dielectric layer;
   forming a channel layer on the gate dielectric layer; and
   forming source/drain regions on the channel layer.

16. The method of claim 15, wherein forming the gate electrode and forming the trench comprises:
   patterning the dielectric layer to form an opening in the dielectric layer;
   forming a gate electrode material on a top surface of the dielectric layer and in the opening; and
   removing a portion of the gate electrode material and a portion of the dielectric layer through an over-polishing process, so as to form the gate electrode and the trench above the gate electrode.

17. The method of claim 15, wherein forming the gate electrode and forming the trench comprises:
   patterning the dielectric layer to form a first opening in the dielectric layer;
   forming a gate electrode material on a top surface of the dielectric layer and in the first opening;
   removing a portion of the gate electrode material until the dielectric layer is exposed to form an intermediate gate electrode in the dielectric layer, wherein a top surface of the intermediate gate electrode is substantially coplanar with a top surface of the dielectric layer;
   forming a photoresist layer over the dielectric layer, wherein the photoresist layer has a second opening exposing the top surface of the intermediate gate electrode and a portion of the top surface of the dielectric layer;
   removing a portion of the intermediate gate electrode and a portion of the dielectric layer exposed by the photoresist layer through an etching process, so as to form the gate electrode and the trench above the gate electrode; and removing the photoresist layer.

18. The method of claim 15, further comprising:

forming a cap layer on the source/drain regions.

19. The method of claim 15, wherein an area of a bottom surface of the short range order layer is formed to be larger than an area of the top surface of the gate electrode.

20. The method of claim 15, wherein the metallic material comprises TiN, WN, CoTiN, MON, TaN, or a combination thereof, and the dopant comprises Mg, Al, Ti, Ca, Mn, Si, or a combination thereof.

* * * * *